United States Patent
Novack et al.

(10) Patent No.: US 9,461,389 B2
(45) Date of Patent: Oct. 4, 2016

(54) SECURING AND LOCKING SYSTEM FOR AN ELECTRONIC MODULE

(71) Applicant: SIEMENS INDUSTRY, INC., Alpharetta, GA (US)

(72) Inventors: Edward A. Novack, New Kensington, PA (US); Todd Robert Locker, Jr., Wexford, PA (US)

(73) Assignee: SIEMENS AKTIENGESELLSCHAFT, München (DE)

( * ) Notice: Subject to any disclaimer, the term of this patent is extended or adjusted under 35 U.S.C. 154(b) by 0 days.

(21) Appl. No.: 14/424,276

(22) PCT Filed: Aug. 26, 2013

(86) PCT No.: PCT/US2013/056579
§ 371 (c)(1),
(2) Date: Feb. 26, 2015

(87) PCT Pub. No.: WO2014/035866
PCT Pub. Date: Mar. 6, 2014

(65) Prior Publication Data
US 2015/0249299 A1    Sep. 3, 2015

Related U.S. Application Data

(60) Provisional application No. 61/693,516, filed on Aug. 27, 2012.

(51) Int. Cl.
*H01R 13/428* (2006.01)
*H05K 7/14* (2006.01)
*H01R 25/16* (2006.01)

(52) U.S. Cl.
CPC .......... *H01R 13/428* (2013.01); *H01R 25/162* (2013.01); *H05K 7/1411* (2013.01); *H05K 7/1457* (2013.01)

(58) Field of Classification Search
CPC .................... H01R 13/6275; H01R 13/62938; H01R 13/6271; H01R 13/62955; H01R 13/6273
See application file for complete search history.

(56) References Cited

U.S. PATENT DOCUMENTS

| 4,752,911 | A | 6/1988 | Prevost et al. |
| 6,354,164 | B1 | 3/2002 | Megason et al. |
| 7,704,092 | B2 * | 4/2010 | Yu ........................ H05K 7/1405 385/92 |

(Continued)

FOREIGN PATENT DOCUMENTS

| GB | 921395 A | 3/1963 |
| SU | 924930 B | 4/1982 |
| SU | 1688454 A1 | 10/1991 |

*Primary Examiner* — Truc Nguyen

(57) ABSTRACT

Embodiments include an electronic module having a chassis, a locking member rotatably connected to the chassis, and a bus bar system comprising a plurality of bus bars. The electronic module includes a plurality of power plug connectors configured such that each of the plurality of bus bars is connected to at least one power plug connector, wherein each of the power plug connectors is configured to receive at least a portion of a system bus thereby establishing an electrical connection between each of the plurality of bus bars and the system bus. The locking member is configured to connect the electronic module to the system bus such that the plurality of power plug connectors establish an electrical connection between the bus bar system and the system bus and wherein the locking member is configured to lock to the chassis once the electrical connection has been established.

19 Claims, 9 Drawing Sheets

(56) References Cited

U.S. PATENT DOCUMENTS

| | | | |
|---|---|---|---|
| 2004/0077198 A1* | 4/2004 | Schlack | H05K 7/1409 439/160 |
| 2005/0136715 A1* | 6/2005 | Schlack | H05K 7/1409 439/160 |
| 2006/0134953 A1* | 6/2006 | Williams | H05K 7/1411 439/157 |
| 2007/0002550 A1 | 1/2007 | Strmiska et al. | |
| 2007/0111574 A1* | 5/2007 | Oila | H05K 7/1409 439/188 |
| 2009/0080147 A1 | 3/2009 | Kunkle et al. | |

\* cited by examiner

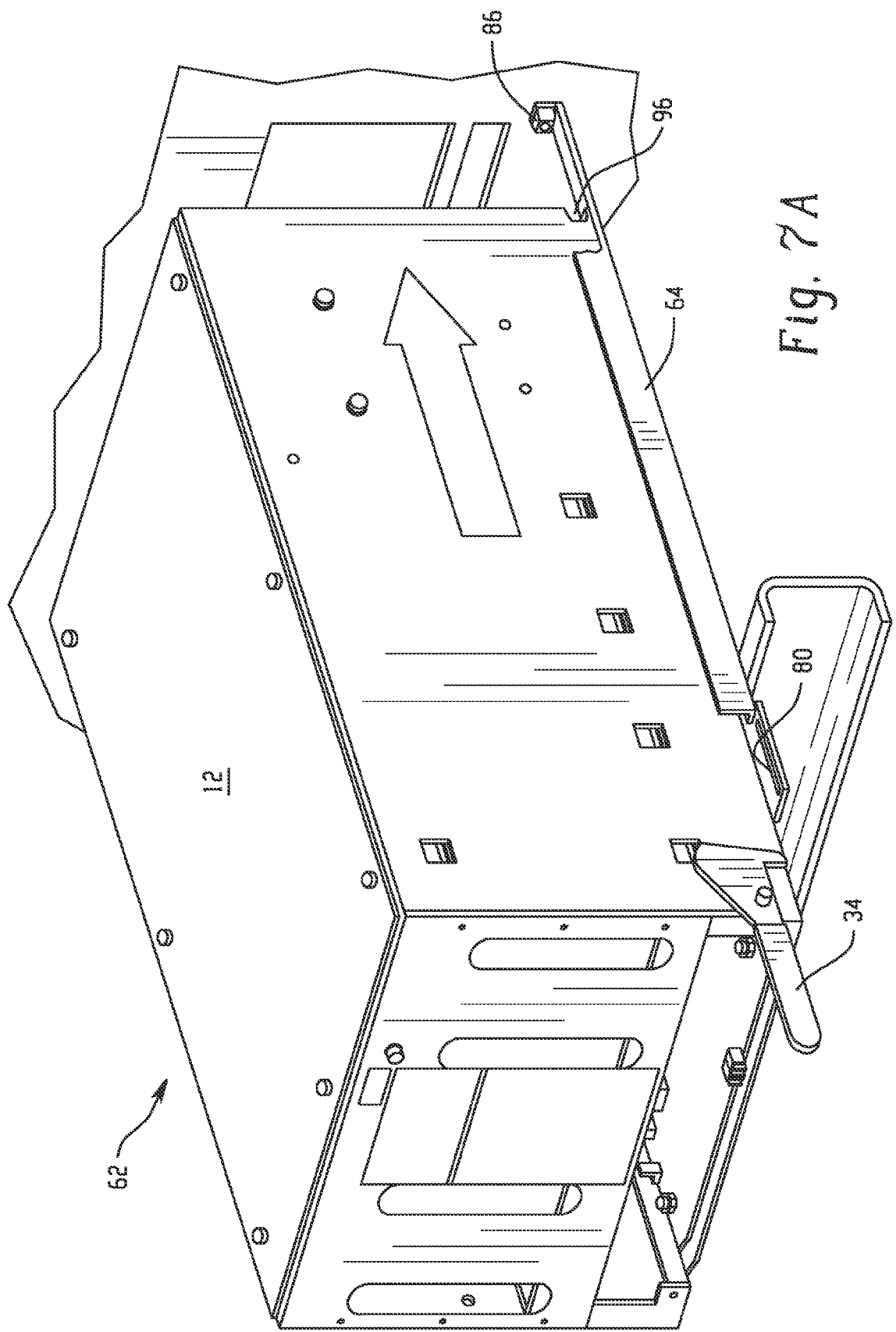

US 9,461,389 B2

SECURING AND LOCKING SYSTEM FOR AN ELECTRONIC MODULE

CROSS REFERENCE TO RELATED APPLICATIONS

This application claims the priority benefit of U.S. Provisional Patent Application No. 61/693,516, filed on Aug. 27, 2012.

BACKGROUND

The present invention relates generally to an electronic module and more specifically to, electronic module for use with an interlocking bus system.

Electronic modules come in a variety of shapes and sizes, and are utilized in a wide range of applications. For example, in some applications, the electronic modules form portions of a power supply. In general, the weight of each electronic module in a power supply varies with its overall size. For an electronic module having a higher weight, the higher weight makes it more difficult to install the electronic module in the desired position and/or remove the electronic module from the power supply.

Each electronic module which forms a portion of a power supply may accept three-phase AC input power and output a single-phase AC voltage. Thus, for such applications, five electrical connections (three inputs and two outputs) are required for each electronic module. When an electronic module is subjected to dynamic conditions such as acceleration or vibration small amounts of relative movement between the electronic module and the mounting structure holding the electronic module are possible. This relative movement can cause wear to electrical connections between the electronic module and the mounting structure and in some cases disengagement from the mounting structure.

SUMMARY

According to one embodiment, an electronic module includes a chassis, a locking member rotatably connected to the chassis, and a bus bar system comprising a plurality of bus bars. The electronic module includes a plurality of power plug connectors configured such that each of the plurality of bus bars is connected to at least one power plug connector, wherein each of the power plug connectors is configured to receive at least a portion of a system bus thereby establishing an electrical connection between each of the plurality of bus bars and the system bus. The locking member is configured to connect the electronic module to the system bus such that the plurality of power plug connectors establish an electrical connection between the bus bar system and the system bus and wherein the locking member is configured to lock to the chassis once the electrical connection has been established.

According to another embodiment, an interlocking bus system includes a system bus and an electronic module connected to the system bus. The electronic module includes a chassis, a locking member rotatably connected to the chassis, a bus bar system comprising a plurality of bus bars, and a plurality of power plug connectors configured such that each of the plurality of bus bars is connected to at least one power plug connector, wherein each of the power plug connectors is configured to receive at least a portion of the system bus thereby establishing an electrical connection between each of the plurality of bus bars and the system bus. The interlocking bus system also includes a pair of module support rails configured to support the electronic module. The locking member is configured to connect the electronic module to the system bus such that the plurality of power plug connectors establish an electrical connection between the bus bar system and the system bus and wherein the locking member is configured to lock to the chassis once the electrical connection has been established.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 7A, 7B and 7C illustrate an electronic module of the system of FIG. 5A at various stages of the process for loading the electronic module into the system shown in FIG. 5A.

DETAILED DESCRIPTION

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Figure 1:
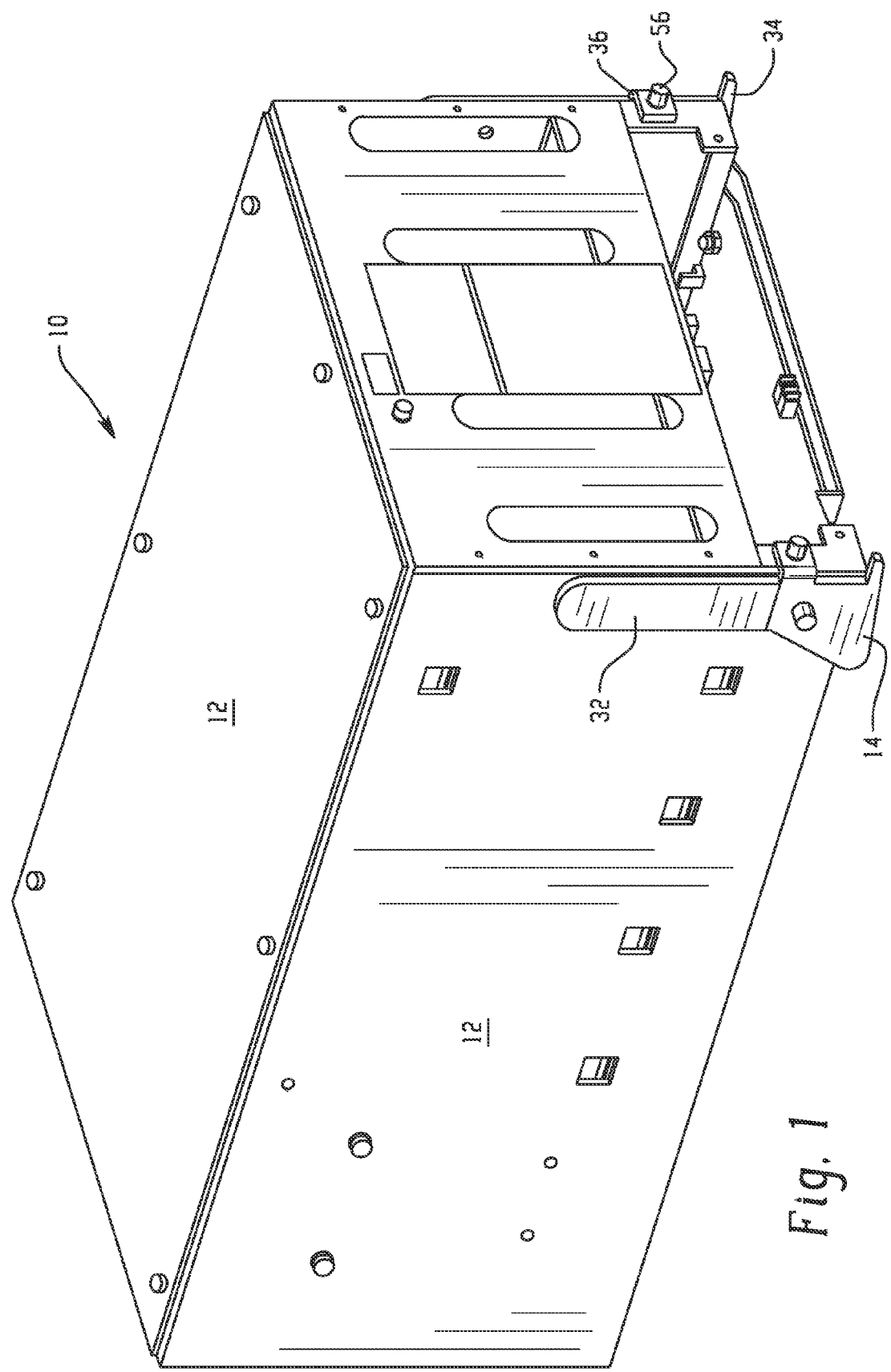
FIG. 1 illustrates an embodiment of an electronic module.

FIG. 1 illustrates an embodiment of an electronic module 10. The electronic module 10 may be implemented as any type of module such as, for example, a power cell, a power supply, an inverter, a drive chassis, etc. According to various embodiments, the electronic module 10 is implemented as a power cell which accepts three phase AC input power and outputs a single phase AC voltage. Such a power cell is described in U.S. Pat. No. 5,625,545, and includes an AC-to-DC rectifier, a smoothing circuit, an output DC-to-AC converter, and a control circuit.

The electronic module 10 includes a chassis 12 and a locking member 14 connected to the chassis 12. According to various embodiments, the chassis 12 may be comprised of several portions connected together (e.g., a top, a bottom, and four sides), and one or more portions of the chassis 12 may be removable. The chassis 12 defines an exterior portion of the electronic module 10, and encloses various components (e.g., any or all of the following: capacitors, printed circuit boards, heat sink, etc.) of the electronic module 10. The chassis 12 may be fabricated from any suitable material. For example, according to various embodiments, the chassis 12 is fabricated from a conductive material such as, galvanized steel. For such embodiments, the conductive material of the chassis 12 may serve to provide a low impedance path for arcing faults within the chassis 12 to minimize potential damage caused thereby. The chassis 12 may be of a thickness sufficient to prevent any debris resulting from a failure of an internal component of the electronic module 10 from exiting the space enclosed by the chassis 12, thereby preventing any collateral damage to other components in the vicinity of the electronic module 10. In addition, the chassis 12 may serve to protect internal components of the electronic module 10 from damage during shipping and handling, and may be configured in a manner such that the electronic module 10 can be placed on any of its sides without causing any damage to the components of the electronic module 10. Furthermore, the chassis 12 may also define an air plenum utilized to assist in the forced air cooling of all components within the chassis 12.

Figure 2:
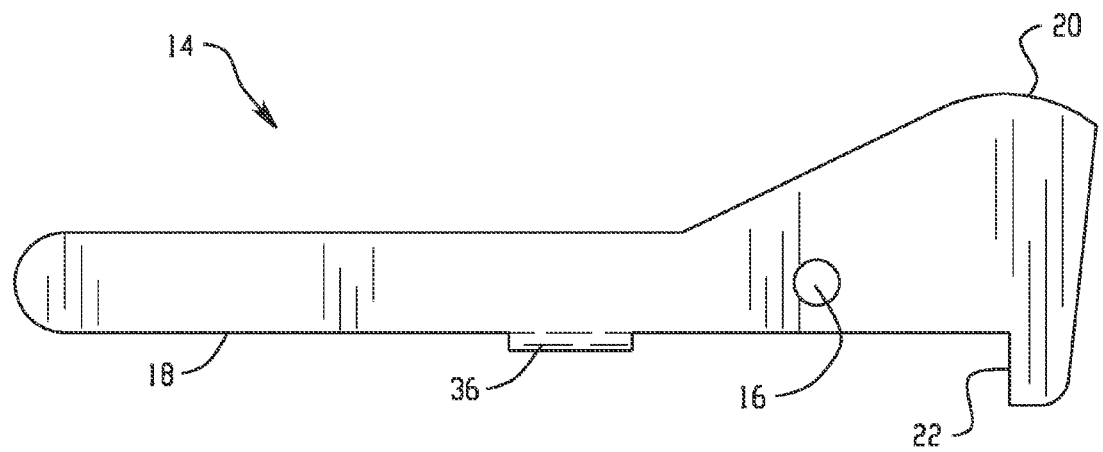
FIG. 2 illustrates an embodiment of a locking member for the electronic module of FIG. 1.

FIG. 2 illustrates an embodiment of the locking member 14. The locking member 14 defines an opening 16 and includes a handle portion 18, a curved portion 20, a tab portion 22, a wrap portion 36 and an aperture 38. As shown in FIG. 2, the curved portion 20 is adjacent the handle portion 18, and the tab portion 22 is opposite the curved portion 20. The wrap portion 36 is disposed on the handle portion 18 and the aperture 38 is disposed on the wrap portion 36. The locking member 14 may be fabricated from any suitable material such as, for example, galvanized steel. The handle portion 18, the curved portion 20, the tab portion 22 and the wrap portion 36 may be fabricated separately or integral with one another.

Figure 3:
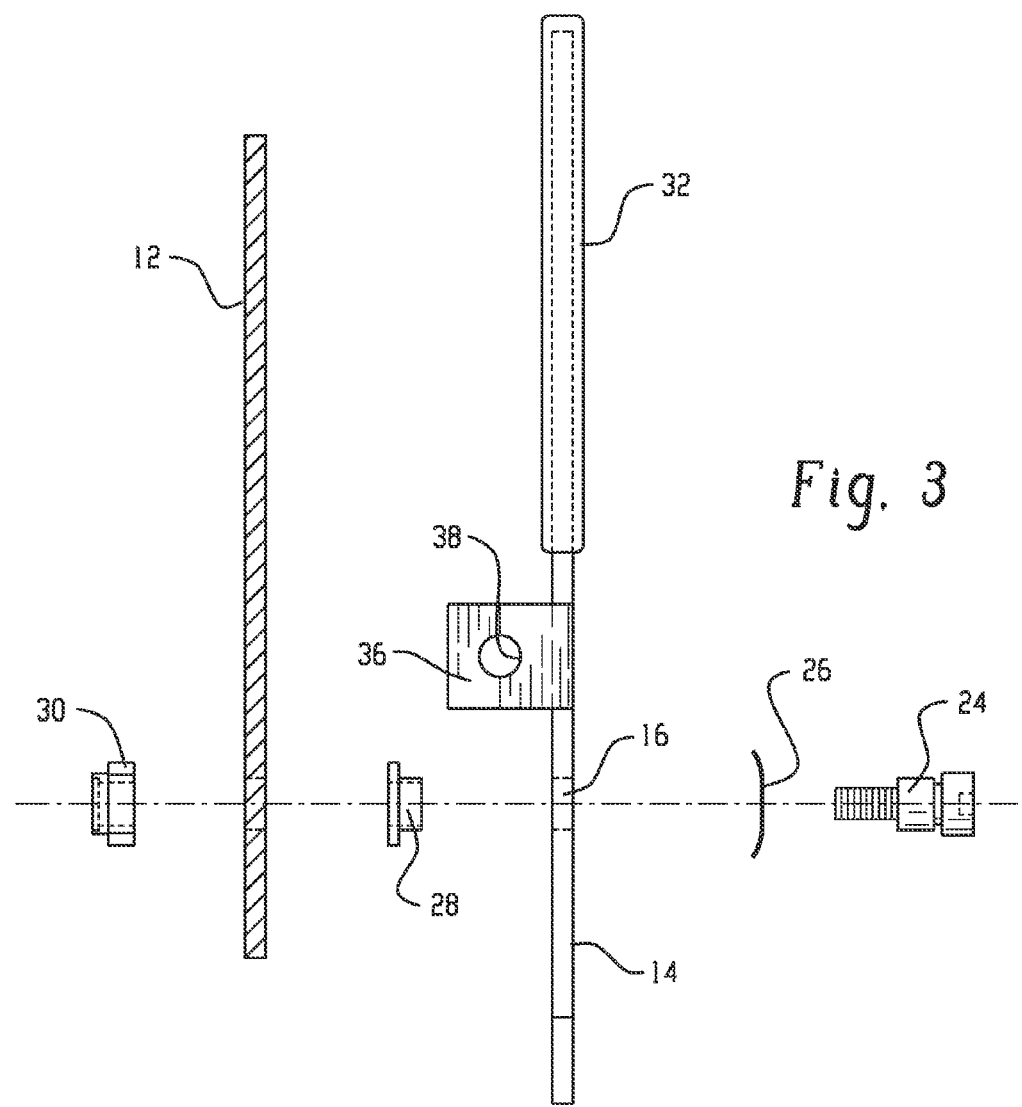
FIG. 3 illustrates an embodiment of a connection between a locking member and a chassis of the electronic module of FIG. 1.

The locking member 14 may be connected to the chassis 12 in any suitable manner. For example, the locking member 14 may be rotatably connected to one of the sides of the chassis 12. FIG. 3 illustrates an embodiment of a rotatable connection between the locking member 14 and the chassis 12. For such embodiments, the rotatable connection is made with a shoulder screw 24 that passes through a spring washer 26, through the opening 16, through a shoulder washer 28 positioned between the first locking member 14 and the chassis 12, through an opening in the chassis 12, and is threadedly connected to nut 30. In one embodiment, the nut 30 may be a self-clinching nut that is connected to the chassis 12. The shoulder washer 28 allows the locking member 14 to rotate while remaining connected to the chassis 12 and the spring washer 26 provides rotational resistance to the locking member 14.

The handle portion 18 may be of any shape suitable for gripping by a human hand. For example, according to various embodiments, the shape of the handle portion 18 may be an elongated shape having a substantially rectangular cross-section. In one embodiment, the locking member 14 may also include a covering 32, as shown in FIG. 1, on at least a portion of the handle portion 18. The covering 32 may serve to protect a user against any sharp edges and may be fabricated from any suitable material such as, for example, a rubber, a vinyl, a plastic, etc. The curved portion 20 and the tab portion 22 may be of any shape suitable for cooperating to install, secure or remove the electronic module 10 from a system such as, for example, a power supply.

According to various embodiments, the curved portion 20 is generally cam-shaped, and the tab portion 22 is generally rectangular-shaped.

The wrap portion 36 locking member 14 extends from the handle portion 18 and/or the curved portion 20 and has a shape that wraps around the front of the chassis 12, when the locking member 14 is in a locked position. In exemplary embodiments, the wrap portion 36 includes an aperture 38 that may be used with a fastener 56 to secure the wrap portion 36 to the chassis 12. In exemplary embodiments, the fastener 56 may be a bolt that can be threadedly connected to the chassis 12. In other embodiments, the wrap portion 36 may be fastened, or otherwise secured, to the chassis 12 using any of a variety of known techniques or fasteners.

Returning to FIG. 1, according to various embodiments, the electronic module 10 also includes a second locking member 34 connected to the chassis 12. The second locking member 34 may be identical to the locking member 14. Thus, the second locking member 34 may include a handle portion, a curved portion adjacent the handle portion, a tab portion opposite the curved portion, a wrap portion on the handle portion and a covering on the handle portion. Additionally, the second locking member 34 may be connected to the chassis 12 in a manner identical to that described with respect to the locking member 14. Thus, the second locking member 34 may be rotatably connected to the chassis 12. As shown in FIG. 1, the locking member 14 and the second locking member 34 are connected to opposite sides of the electronic module 10.

Figure 4:
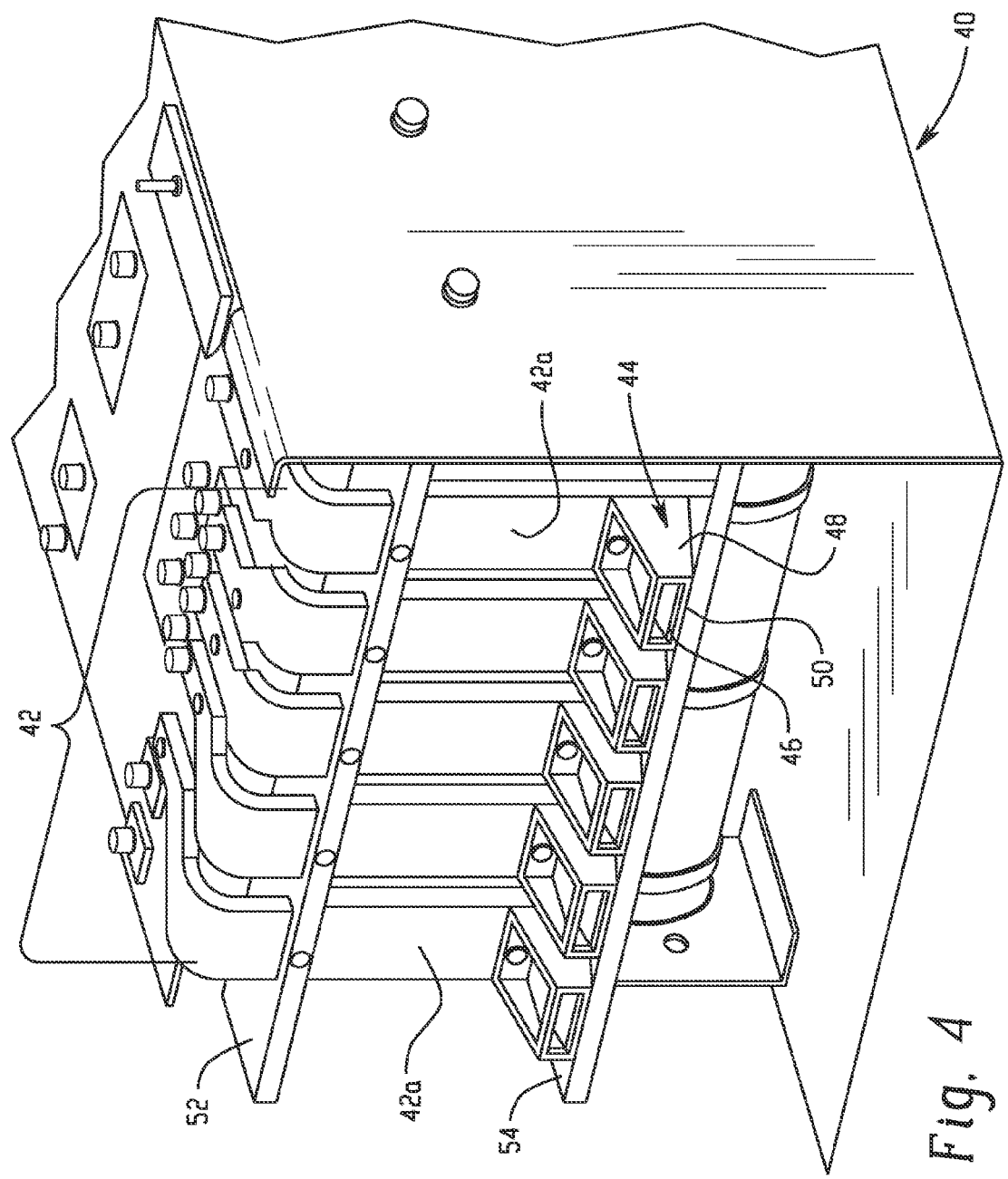
FIG. 4 illustrates an embodiment of an electronic module.

FIG. 4 illustrates various embodiments of an electronic module 40. According to various embodiments, the electronic module 40 includes all of the features described with respect to the electronic module 10 of FIG. 1. The electronic module 40 includes a bus bar system 42 and a power plug connector 44 connected to the bus bar system 42. The bus bar system 42 includes a plurality of bus bars 42a. The respective bus bars may be fabricated from any suitable conductive material, and are collectively configured to route power to and from the electronic module 10. At least two of the bus bars 42a are configured as input bus bars and at least two of the bus bars 42a are configured as output bus bars. The number, size and shape of the bus bars 42a can vary by application. In general, the respective bus bars 42a are sized to accommodate requirements associated with a particular application.

The power plug connector 44 includes a conductive material 46 and a housing 48 which surrounds the conductive material 46. The conductive material 46 may be fabricated from any suitable conductor such as, for example, copper. The housing 48 may be fabricated from any suitable insulating material such as, for example, a plastic. The housing 48 defines an opening configured to receive a portion of a system bus when the electronic module 40 is connected to the system bus. The opening surrounds the conductive material 46, and the conductive material 46 defines a smaller opening configured to receive the portion of the system bus when the electronic module 40 is connected to the system bus. Thus, the housing 48 and the conductive material 46 collectively define an opening 50 which is sized to receive the portion of the system bus when the electronic module 40 is connected to the system bus.

The power plug connector 44 may be connected to the bus bar system 42 in any suitable manner For example, according to various embodiments, the power plug connector 44 is mechanically connected to the bus bar system 42 via fasteners (e.g., screws or nuts and bolts) in a manner that places the conductive material 46 in direct contact with the bus bar system 42. Thus, the bus bar system 42 may also act as a heat sink for the power plug connector 44. The power plug connector 44 is configured such that it can be connected to the bus bar system 42 in a manner that the permits some movement of the power plug connector 44. As shown in FIG. 4, the electronic module 40 may include a plurality of power plug connectors 44 connected to the bus bar system 42.

According to other embodiments, the power plug connectors may be configured in a different manner For example, according to various embodiments, a given power plug connector may include a male portion and a separate female portion which collectively function to connect the electronic module 40 to the system bus. For some embodiments, the male portion is connected to bus bar system 42 and the female portion is connected to the system bus. In other embodiments, the male portion is connected to system bus and the female portion is connected to the bus bar system 42. In general, for a given application, the particular configuration of power plug connectors are selected to accommodate requirements associated with a particular application.

According to various embodiments, the electronic module 40 also includes a bus bar system support 52. The bus bar system support 52 may be fabricated from any suitable non-conductive material such as, for example, a plastic, a fiberglass, etc., and may serve to reduce mechanical stresses on components within the electronic module 40. The bus bar system support 52 may also serve to align the various bus bars 42 a of the bus bar system 42 and provide mechanical support thereto. According to various embodiments, the electronic module 40 also includes a second bus bar system support 54 as shown in FIG. 4. The second bus bar system support 54 may be similar to the bus bar system support 52 and may provide similar functionality.

Figure 5A:
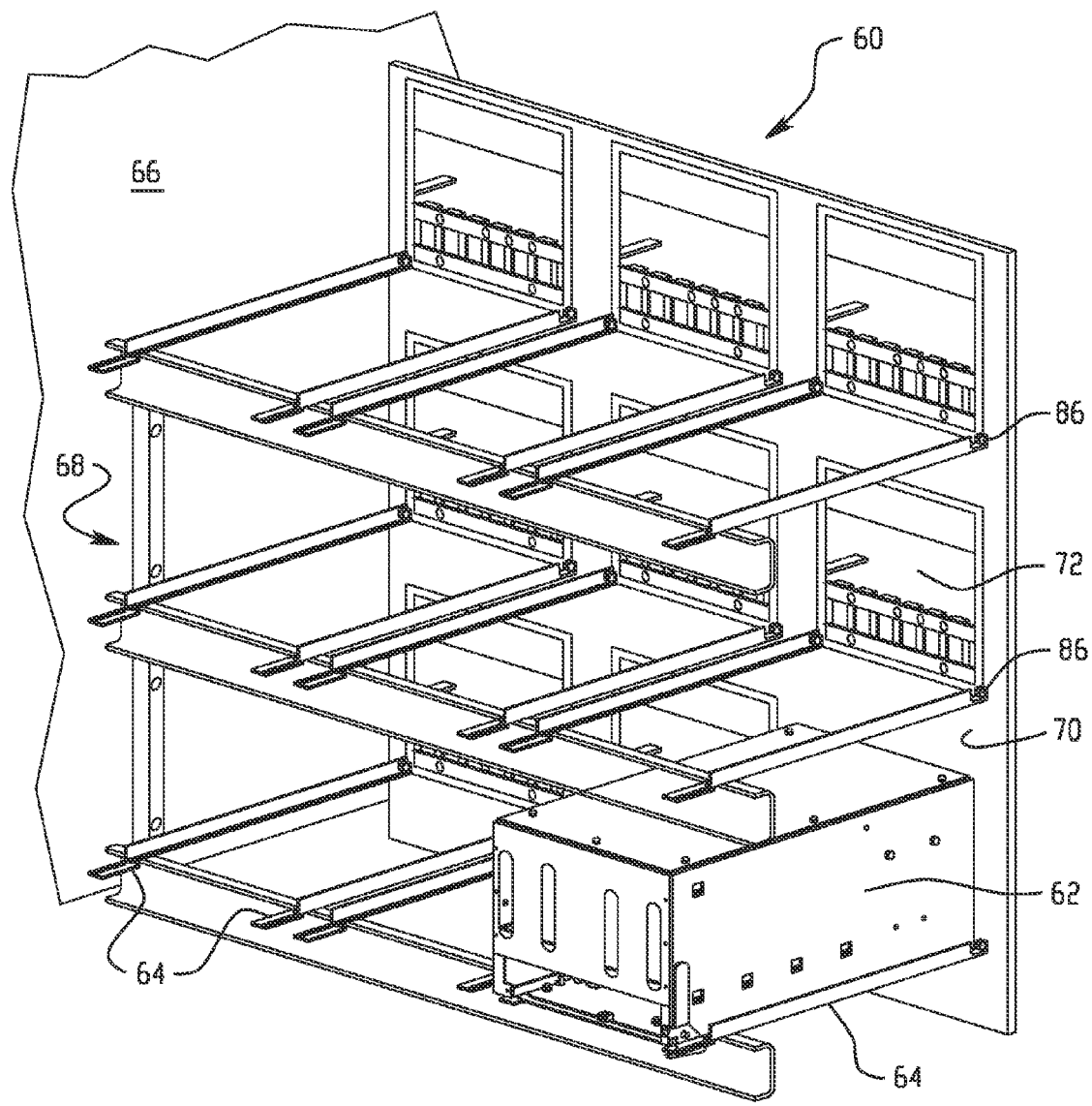
FIGS. 5A and 5B illustrate various embodiments of a system.
Figure 5B:
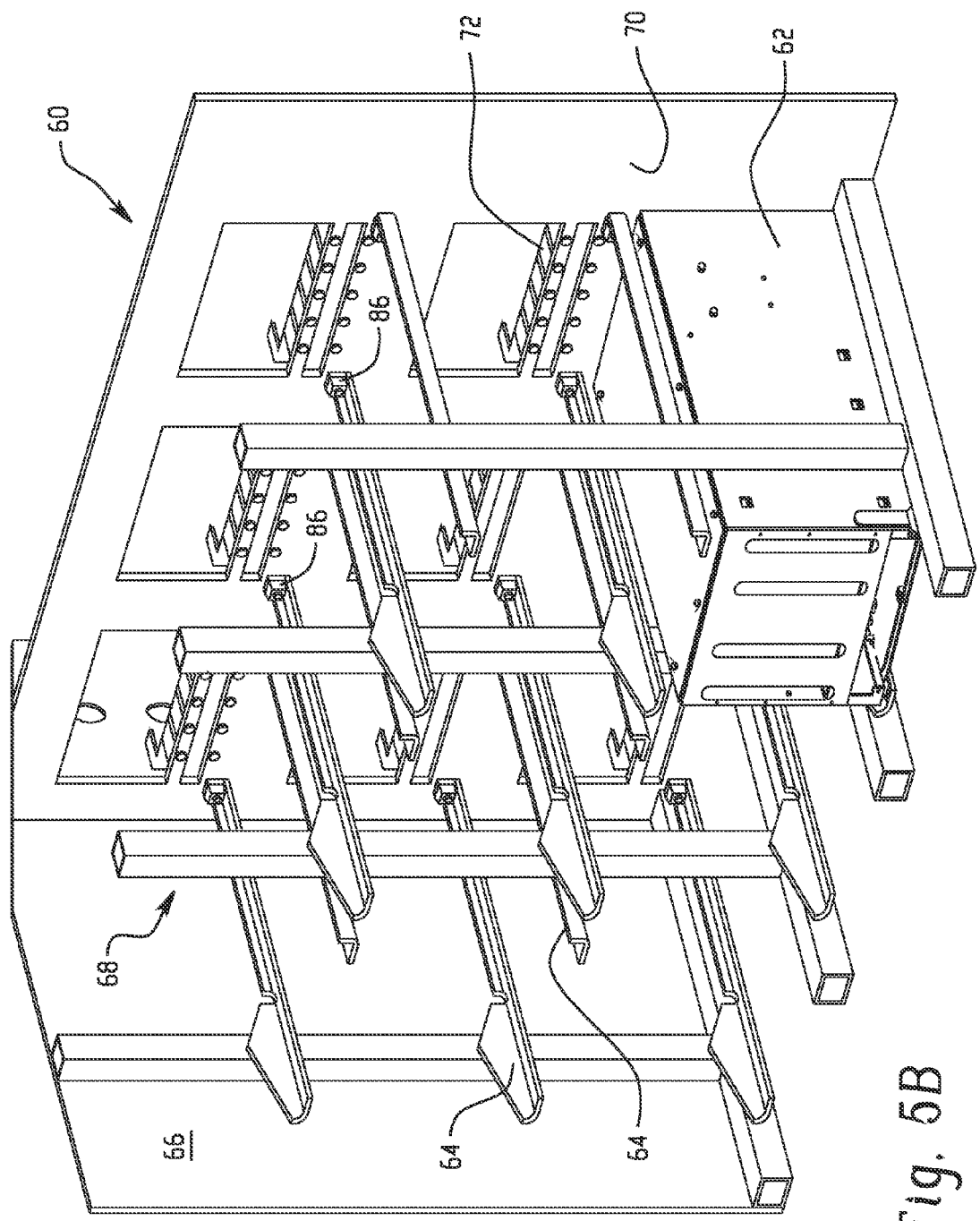

FIGS. 5A and 5B illustrate various embodiments of a system 60. The system 60 may be utilized in a variety of applications. For example, the system 60 may be utilized as a power supply. The system 60 includes an electronic module 62. According to various embodiments, the electronic module 62 includes all of the features described with respect to the electronic module 10 of FIG. 1 and/or the electronic module 40 of FIG. 4. According to various embodiments, the system 60 may include any number of electronic modules 62. For example, according to various embodiments, the system 60 may include anywhere from one to twenty-four electronic modules 62. For purposes of clarity only one electronic module 62 is shown in FIG. 5A and only one electronic module 62 is shown in FIG. 5B.

The system 60 also includes a plurality of module support rails 64. The module support rails 64 are arranged in pairs, with one module support rail 64 of the pair being a mirror-image of the other module support rail 64. Each pair of the module support rails 64 are in contact with and provides mechanical support for a given electronic module 62 once the given electronic module 62 is installed in the system 60. Each of the module support rails 64 includes a lock block 86 disposed at the module support rails 64 adjacent to the backplane 70. The lock block 86 is a tapered block that is securely fastened to the module support rail 64 and the backplane 70. The module support rails 64 also serve to guide the path of the electronic modules 62 when loading or unloading the electronic modules 62 into or out of the system 60.

Figure 5C:
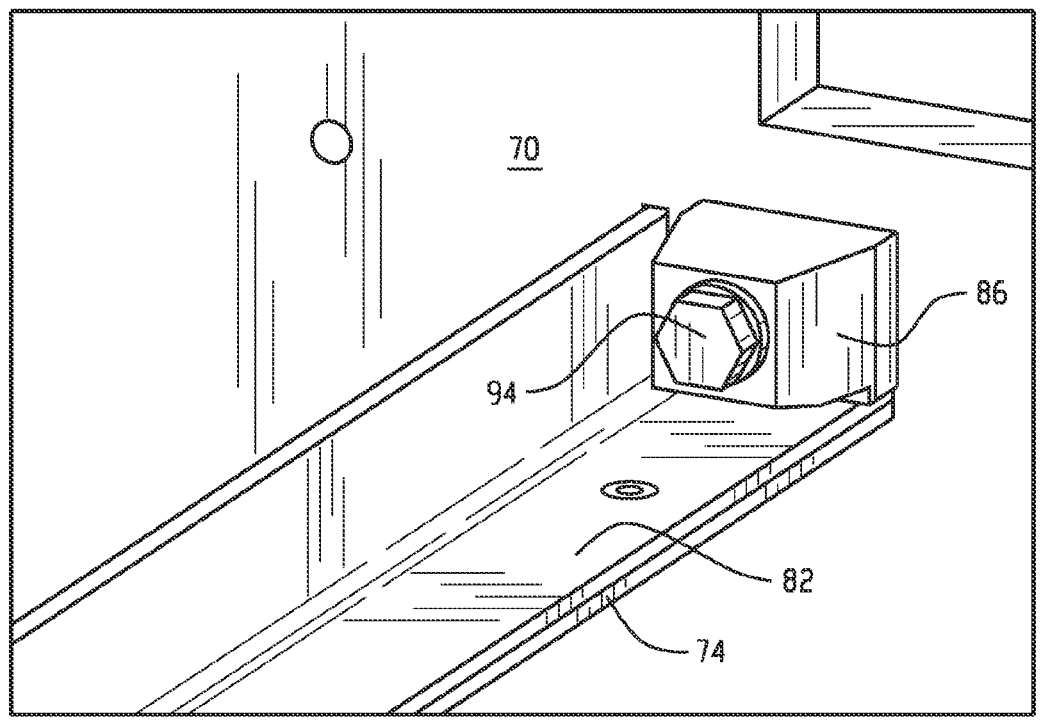
FIGS. 5C and 5D illustrate a portion of the system shown in FIG. 5A.
Figure 5D:
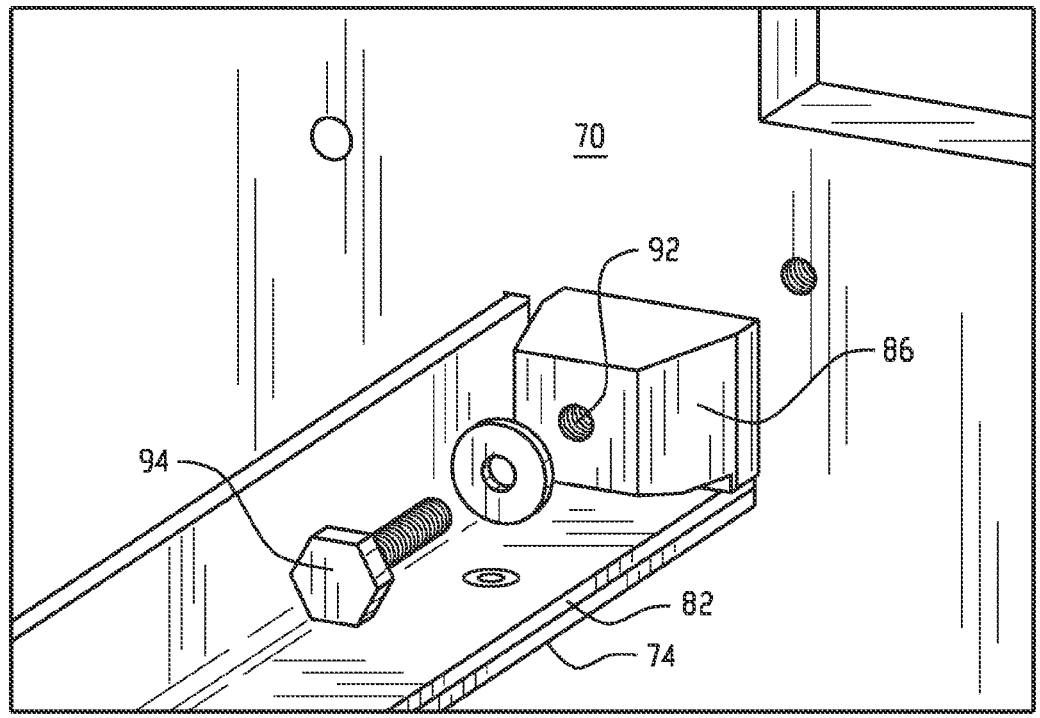

The module support rails 64 and the lock block 86 prevent side to side movement of the electronic modules 62 once the electronic modules 62 are installed in the system 60, and to help hold the electronic modules 62 in place once they are installed in the system 60. In exemplary embodiments, the lock block 86 may be made of any suitable non-conductive material, e.g., rubber or the like. FIGS. 5C and 5D illustrate a portion of the system 60 shown in FIG. 5A illustrating the lock block 86. FIG. 5D illustrates the lock block 86 which includes an aperture 92 for receiving a fastener 94. In exemplary embodiments, the fastener 94 may be a bolt that is used to affix the lock block 86 to the backplane 70 of the system. FIG. 5D illustrates the lock block after it has been secured to the backplane 70 by the fastener 94.

The module support rails 64 may be fabricated from any suitable material. For example, according to various embodiments, the module support rails 64 are fabricated from a conductive material (e.g., a metal). According to other embodiments, the module support rails 64 are fabricated from a non-conductive material (e.g., a non-metallic material). Various embodiments of the module support rails 64 are described in more detail herein below with respect to FIG. 6.

The system 60 may also include a system enclosure 66, an enclosure support structure 68, a backplane 70, and a system bus 72. For purposes of clarity, only a portion of the system enclosure 66 is shown in FIGS. 5A and 5B. The system enclosure 66 may be fabricated from any suitable material such as, for example, galvanized steel. The system enclosure 66 serves to enclose the various components of the system 60, may define any number of openings or knockouts (e.g., for power and control connections), and may include any number of hinged or removable panels that provide for access to and maintenance of the various components within the system enclosure 66.

The enclosure support structure 68 is positioned within and connected to the system enclosure 66. The enclosure support structure 68 may be connected to the system enclosure 66 in any suitable manner For example, according to various embodiments, the enclosure support structure 68 may be removably connected to the system enclosure 66 via mechanical fasteners. According to other embodiments, the enclosure support structure 68 may be welded to the system enclosure 66. The enclosure support structure 68 may be configured in a horizontal arrangement as shown in FIG. 5A or in a vertical arrangement as shown in FIG. 5B. For a given size electronic module 62, the vertical arrangement of the enclosure support structure 68 may be utilized to keep the overall height of the system 60 lower than if a horizontal arrangement of the enclosure support structure 68 was utilized.

The backplane 70 may be fabricated from any suitable non-conductive material. According to various embodiments, the backplane 70 is fabricated from a high-strength non-conductive laminate material. The backplane 70 may be connected to the enclosure support structure 68 via mechanical fasteners such as screws or nuts and bolts. The backplane 70 defines a number of openings configured to allow visual inspection of the connections between the power plug connectors of the electronic module 62 and the system bus 72. The backplane 70 also defines a number of openings (e.g., slots or slits) configured to receive a portion of the module support rails 64 as described in more detail herein below.

Figure 6:
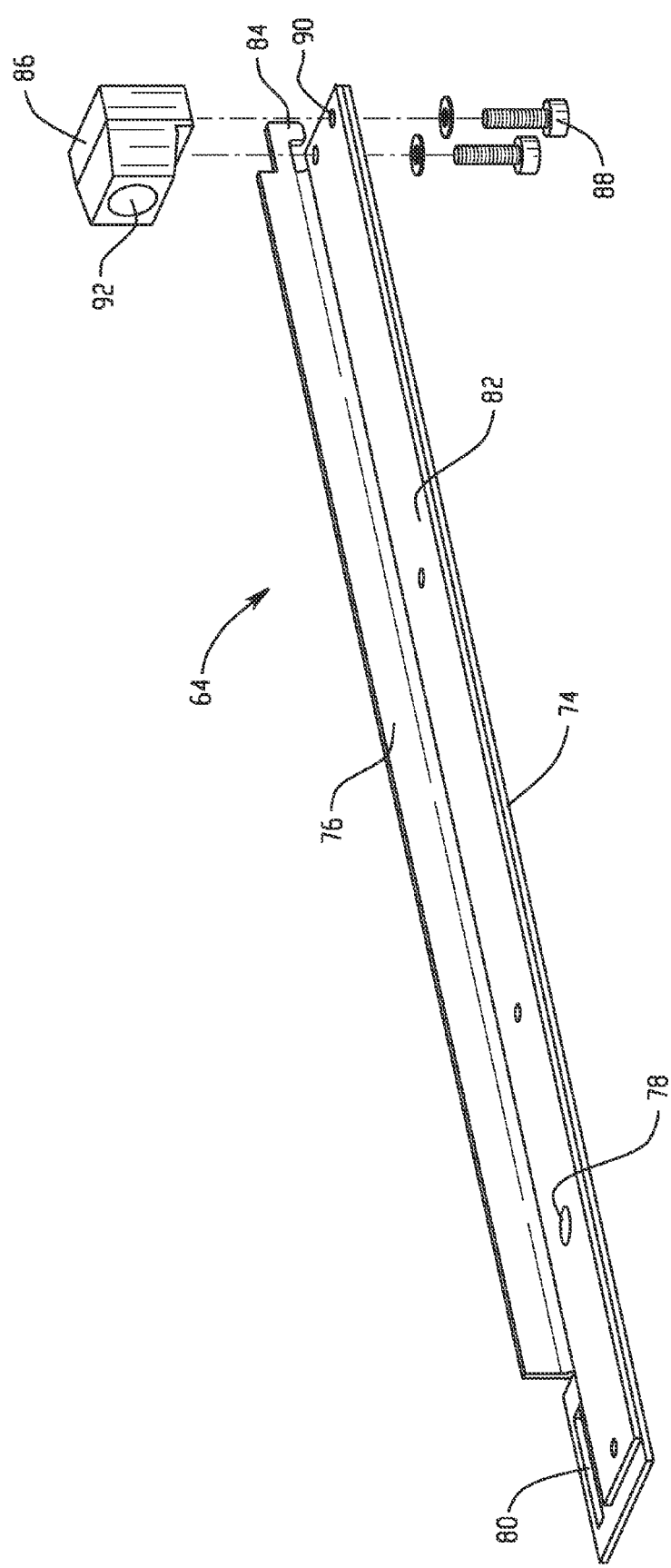
FIG. 6 illustrates various embodiments of a module support rail of the system shown in FIG. 5A.

FIG. 6 illustrates various embodiments of one of the module support rails 64 of the system 60 of FIG. 5A. According to various embodiments, each module support rail 64 includes a first section 74, and a second section 76 oriented substantially normal to the first section 74. The first section 74 defines an opening 78 configured to align with an opening of the enclosure support structure 68 to facilitate connection of a module support rail 64 to the enclosure support structure 68. The first section 74 also defines one or more openings 80 configured to receive the tab portion and the curved portion of the locking member of the electronic module 62 and/or the tab portion and the curved portion of the second locking member of the electronic module 62. According to various embodiments, the one or more openings 80 are configured as slots or slits. Each module support rail 64 may also include a low friction material 82 such as, for example, polyethylene, attached to the first section 74. The low friction material 82 serves to minimize the effort needed to load/unload the electronic module 62 into or out of the system 60.

The second section 76 includes a portion 84 configured to pass through an opening (e.g., a slot or a slit) defined by the backplane 70 and provide an interlocked connection therewith. According to various embodiments, the portion 84 may be a generally hook-shaped portion as shown in FIG. 6. For enclosure support structures 68 utilizing a vertical arrangement as shown in FIG. 5B, the second section 76 defines an opening similar to opening 78 and configured to align with an opening of the enclosure support structure 68 to facilitate connection of the module support rail 64 to the enclosure support structure 68.

In exemplary embodiments, a lock block 86 is affixed to the end of the module support rail 64 that portion 84. The lock block 86 may be fastened to the module support rail 64 by one or more bolts 88 that are configured to pass through openings 90 in the module support rail 64 and the low friction material 82. In addition, the lock block 86 may include an aperture 92 that is configured for affixed the lock block 86 to the backplane with a bolt or other fastener (not shown). In exemplary embodiments, the lock block 86 have shape that is tapered from the backplane, such as a square frustum. The electronic module includes an opening (not shown) that is configured to matingly receive the tapered shape of the lock block 86 to securely fasten the electronic module to the module support rail 64. During the installation the tapers on the lock block 86 guide electronic module cell into place, helping to eliminate bus or power plug damage due to misalignment. Once the electronic module is fully inserted the lock block 86 pinches against the electronic module chassis helping to mitigate motion relative to the electronic module chassis and the backplane.

Figure 7B:
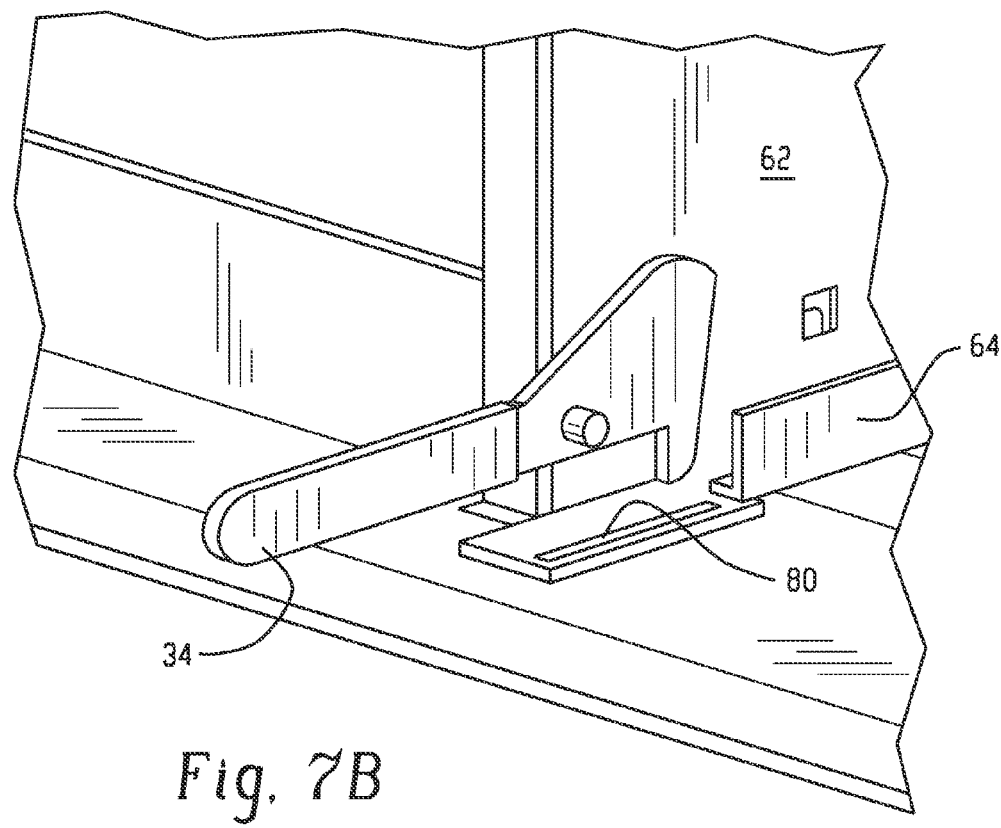
Figure 7C:
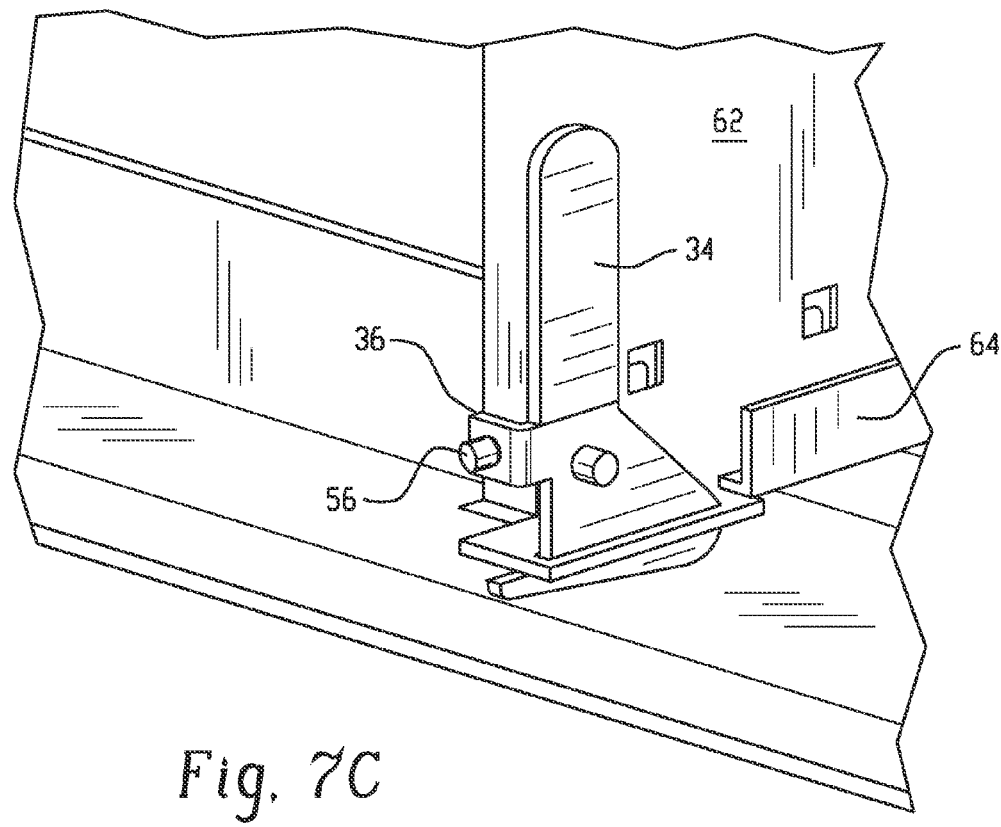

FIGS. 7A-7C illustrate the electronic module 62 at various stages of the process for loading the electronic module 62 into the system of FIG. 5A. As shown in FIG. 7A, the electronic module 62 has been placed on the respective first sections of a pair of module support rails 64, and the handle portion of the locking member 34 has been rotated toward the "front" of the electronic module 62 to a "horizontal" position such that the tab portion 22 of the locking member 34 is positioned at or above the "bottom" of the electronic module 62. The handle portion 18 may be rotated before or after the electronic module 62 has been placed on the respective first sections. As the electronic module 62 is moved along the low friction material on the respective first sections toward the "back" of the system enclosure, the tab portion 22 will approach alignment with the opening 80 e.g., slit or slot, defined by the first section as shown in FIG. 7B. In addition, as the electronic module 62 approaches the "back" of the system enclosure, an opening 96 on the back of the electronic module 62 will engage with the lock block 86 and ensure proper alignment of the electronic module 62 with the opening 80.

Once the tab portion is aligned with the opening 80, the handle portion is rotated "upward" toward a "vertical" position as shown in FIG. 7C. As the handle portion rotates "upward", the curved portion also rotates and cooperates with the first section to cause the power plug connectors to begin to mate with the system bus. As the curved portion rotates, the tab portion also rotates. When the rotation of the handle portion to the "vertical" position is completed, the power plug connectors are fully mated with the system bus, and the electronic module 62 is locked into place using the wrap portion 36 and fastener 38. In exemplary embodiments, by locking the electronic module into place the locking member 15 is prevented from disengaging in a dynamic situation, relative motion of the electronic module is reduced, and a tight interface is maintained between the electronic module and the backplane, i.e., there is no relative motion or air leakage. For embodiments where the electronic module 62 also includes a second locking member, the above-described process is similar, but the rotation of the locking member is accompanied by the concurrent rotation of the second locking member.

The process for unloading the electronic module 62 from the system is the opposite of the loading process described hereinabove. For example, the locking member 34 may be rotated from the "vertical" position to the "horizontal" position, thereby cooperating with the first section to cause the power plug connectors to disengage from the system bus. The electronic module 62 may then be moved along the low friction material on the respective first sections toward the "front" of the system enclosure and removed from the system.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An electronic module, comprising;
   a chassis;
   a locking member rotatably connected to the chassis;
   a bus bar system comprising a plurality of bus bars; and
   a plurality of power plug connectors configured such that each of the plurality of bus bars is connected to at least one power plug connector, wherein each of the power plug connectors is configured to receive at least a portion of a system bus thereby establishing an electrical connection between each of the plurality of bus bars and the system bus, wherein the locking member is configured to connect the electronic module to the system bus such that the plurality of power plug connectors establish an electrical connection between the bus bar system and the system bus and wherein the locking member is configured to lock to the chassis once the electrical connection has been established.

2. The electronic module of claim 1, wherein the locking member comprises:
   a handle portion;
   a curved portion adjacent the handle portion;
   a wrap portion extending in a direction normal to the handle portion; and
   a tab portion opposite the curved portion.

3. The electronic module of claim 2 wherein the wrap portion of the locking member is configured to affix to the chassis with a fastener once the electrical connection has been established.

4. The electronic module of claim 1, wherein the chassis defines an exterior portion of the electronic module.

5. The electronic module of claim 1, wherein the chassis encloses at least one component of the electronic module.

6. The electronic module of claim 1, wherein the chassis is fabricated from a conductive material.

7. An interlocking bus system, comprising:
   a system bus;
   an electronic module connected to the system bus, wherein the electronic module comprises:
      a chassis;
      a locking member rotatably connected to the chassis;
      a bus bar system comprising a plurality of bus bars; and
   a plurality of power plug connectors configured such that each of the plurality of bus bars is connected to at least one power plug connector, wherein each of the power plug connectors is configured to receive at least a portion of the system bus thereby establishing an electrical connection between each of the plurality of bus bars and the system bus; and
   a pair of module support rails configured to support the electronic module, wherein the locking member is configured to connect the electronic module to the system bus such that the plurality of power plug connectors establish an electrical connection between the bus bar system and the system bus and wherein the locking member is configured to lock to the chassis once the electrical connection has been established.

8. The system of claim 7, wherein the locking member comprises:
   a handle portion;
   a curved portion adjacent the handle portion;
   a wrap portion extending in a direction normal to the handle portion; and
   a tab portion opposite the curved portion.

9. The system of claim 8, wherein the wrap portion of the locking member is configured to affix to the chassis with a fastener once the electrical connection has been established.

10. The system of claim 7, further comprising:
    a lock block disposed on an end of each of the pair of module support rails nearest the system bus,
    wherein the chassis comprises an opening configured to matingly receive the lock block as the electronic module is secured by the locking member.

11. The system of claim 10, wherein the lock block has a square frustum shape.

12. The system of claim 10, wherein the lock block is secured to the module support rails.

13. The system of claim 10, wherein the lock block and the locking member are configured to prevent movement of the electronic module relative to the system bus once the locking member is locked to the chassis.

14. The system of claim 10, wherein the electronic module is removably connected to the system bus.

15. The system of claim 7, wherein each of the plurality of power plug connectors comprises:
    a conductive material; and
    a housing which surrounds the conductive material.

16. The system of claim 7, wherein the electronic module further comprises a second locking member rotatably connected to the chassis.

17. The system of claim 16, wherein the locking member and the second locking member are connected to opposite sides of the electronic module.

18. The system of claim 16, wherein the second locking member comprises:
    a handle portion;
    a curved portion adjacent the handle portion;
    a wrap portion extending in a direction normal to the handle portion; and
    a tab portion opposite the curved portion.

19. The system of claim 18, wherein the wrap portion of the second locking member is configured to affix to the chassis with a fastener once the electrical connection has been established.

* * * * *